United States Patent [19]

Borkowski et al.

[11] 4,175,258

[45] Nov. 20, 1979

[54] HIGH LEVEL WHITE NOISE GENERATOR

[75] Inventors: Casimer J. Borkowski, Oak Ridge; Theron V. Blalock, Knoxville, both of Tenn.

[73] Assignee: The United States of America as represented by the United States Department of Energy, Washington, D.C.

[21] Appl. No.: 929,145

[22] Filed: Jul. 28, 1978

[51] Int. Cl.² ............................................. H03B 29/00
[52] U.S. Cl. ........................................................ 331/78
[58] Field of Search .............................................. 331/78

[56] References Cited

U.S. PATENT DOCUMENTS

| 3,573,652 | 4/1971 | Charters | 331/78 |
| 3,866,128 | 2/1975 | Fletcher et al. | 331/78 X |

Primary Examiner—Siegfried H. Grimm
Attorney, Agent, or Firm—Dean E. Carlson; Stephen D. Hamel; David E. Breeden

[57] ABSTRACT

A wide band, stable, random noise source with a high and well-defined output power spectral density is provided which may be used for accurate calibration of Johnson Noise Power Thermometers (JNPT) and other applications requiring a stable, wide band, well-defined noise power spectral density. The noise source is based on the fact that the open-circuit thermal noise voltage of a feedback resistor, connecting the output to the input of a special inverting amplifier, is available at the amplifier output from an equivalent low output impedance caused by the feedback mechanism. The noise power spectral density level at the noise source output is equivalent to the density of the open-circuit thermal noise or a 100 ohm resistor at a temperature of approximately 64,000 Kelvins. The noise source has an output power spectral density that is flat to within 0.1% (0.0043 db) in the frequency range of from 1 KHz to 100 KHz which brackets typical passbands of the signal-processing channels of JNPT's. Two embodiments, one of higher accuracy that is suitable for use as a standards instrument and another that is particularly adapted for ambient temperature operation, are illustrated in this application.

7 Claims, 3 Drawing Figures

HIGH LEVEL WHITE NOISE GENERATOR

This invention was made during the course of, or under, a contract with the U.S. Department of Energy.

BACKGROUND OF THE INVENTION

This invention relates generally to white noise generators and more particularly to a white noise generator which takes advantage of the thermal noise voltage of a resistor connected in a feedback arrangement with a special inverting amplifier to provide a wideband, stable, random, white noise source with a high level and well-defined output power spectral density.

White noise has been defined as random noise having constant energy per unit bandwidth that is independent of the central frequency of the band. The oldest and probably best known source of high-level white noise is the emission-limited vacuum diode. A low noise amplifier is most often used to boost the diodes noise output to a higher level but the frequency response is usually degraded in the process. While this might be overcome, the major problem with the emission-limited diode is that it is an active device whose characteristics are likely to change with time. The cathode, for example, is subject to aging effects. Although the theoretical equations for predicting noise output are well-established, noise generators based on the emission-limited diode are not in common use today.

A gas tube, as a noise source, has one important advantage over the emission-limited diode in that it has a very large noise output without the requirements of substantial amplification. It is also operable up to very high frequencies. On the other hand it is subject to aging caused by the fairly high current carried by the tube; also the equations do not exist that permit the tube's performance to be predicted to be better than about ±10%. As a result, gas tubes are generally used in noise generators having accuracies in the range of from 1 to 5%.

A zener diode is basically the solid-state realization of the gas tube. Like the gas tube, its output noise level is adequately high but it carries a high current, is subject to change with age, and the noise equations, likewise, are not well-established. Therefore, its performance is also not very predictable.

A fourth class of devices are the random noise generators that utilize digital output signals. These devices are not fully digital but are based on gas tubes, etc., and the circuits have much the same limitations as the noise sources they incorporate.

There has long been a need in the instrumentation field, especially in the calibration of signal processing systems including nuclear pulse instruments, operational and other amplifiers, reactor noise spectrum analyzers, Johnson Noise Power Thermometers, etc., for a highly predictable white noise source that overcomes the limitations of existing generators. A simple resistor having negligible DC current flow is probably the most predictable noise source known. Such a resistor exhibits pure thermal noise that is well characterized by thermodynamic principals, and is predictable to very high accuracy up to frequencies of 20 gigahertz or more. The open-circuit noise voltage of a resistor has been well defined mathematically. The mean-squared value of the open-circuit thermal noise voltage of a resistor of known ohmic value and known temperature can be calculated if the resistor is conducting no current. The mean-squared thermal noise voltage can be computed from the Nyquist formula, $$\overline{E_n^2} = 4kTR\Delta f$$

where $\overline{E_n^2}$ is the root mean-squared (RMS) thermal noise voltage, k is the Boltzmann constant, T is the absolute temperature in Kelvins, R is the resistance in ohms, and $\Delta f$ is the noise bandwidth in hertz. This equation is applicable up to very high frequencies (several GHz).

Since the use of a resistor as a high-level noise source requires a high value for R, an attempt to obtain the open-circuit noise voltage can result in severe loading with the usual consequence of strong attenuation (perhaps by stray and amplifier input capacitances) of the high-frequency noise voltage of the resistor. This in turn results in noise output levels that are generally too low to be of any practical value in measurements, such as gain, gain-bandwidth constants, etc., that are expected of the noise generator.

If some DC current is flowing through the resistor, there is a possibility of an additional noise source, known as shot noise, that is due primarily to the way the resistor is made. Metal film resistors have practically no shot noise even with a small DC current flow. Thus, in order to use a resistor as a noise source it would be of primary importance to arrange a high quality metal film resistor in a circuit having practically no DC current flow through the resistor.

SUMMARY OF THE INVENTION

Accordingly, a high power level, wideband, stable, random noise source based upon a resistor as a noise generating source is provided wherein a thermal noise generating feedback network including a resistor is connected between the input and output of a special inverting amplifier to provide a high level white noise generator. The thermal noise voltage of the feedback network is used as the signal input to the amplifier. If the amplifier is designed to have a very low noise and small input capacitance, a white noise spectral density can be obtained at the system output uniform from zero to several megahertz and substantially equal in magnitude to the spectral density of the open-circuit noise voltage of the feedback network resistor. Furthermore, if the system loop transmission is high, the system output impedance will be low enough to allow loading with negligible influence on the output noise spectral density.

Successful implementation of the basic concept of the noise source is realized in an amplifier in which (1) the input bias current is extremely low to both minimize the inherent shot noise associated with the current, and the excess (above thermal) noise that may be generated due to a small direct current flow in the feedback resistor. (2) The amplifier noise is low enough to allow the noise voltage of the feedback resistor to be sufficiently dominant in the system output. (3) The system loop transmission is high enough so that amplifier parameter changes will have negligible effects on the noise output. (4) The pole-zero constellation of the system is adjusted for maximum flatness for the output noise spectral density. These considerations lead to the selection of a low noise junction field-effect transistor (JFET) as the amplifier input device. The output of the JFET is connected through a common-base double cascode amplifier and an impedance converter to provide the output terminal of the noise generator.

Two circuits are described wherein the first is characterized by holding the feedback network resistor at constant temperature (constant T and constant R) and is suitable as a standards instrument; and in the second circuit the feedback network resistor is a synthesized network of resistors that compensate for changes in temperature (constant RT product) to provide an instrument suitable for field use over a limited range of ambient temperature.

Thus, it is a primary object of this invention to provide a high level white noise generator which takes advantage of the thermal noise voltage generated in a resistor.

Other objects and many of the attendant advantages of the present invention will be obvious to those skilled in the art from the following detailed description taken in conjunction with the drawings.

DETAILED DESCRIPTION

Figure 1:
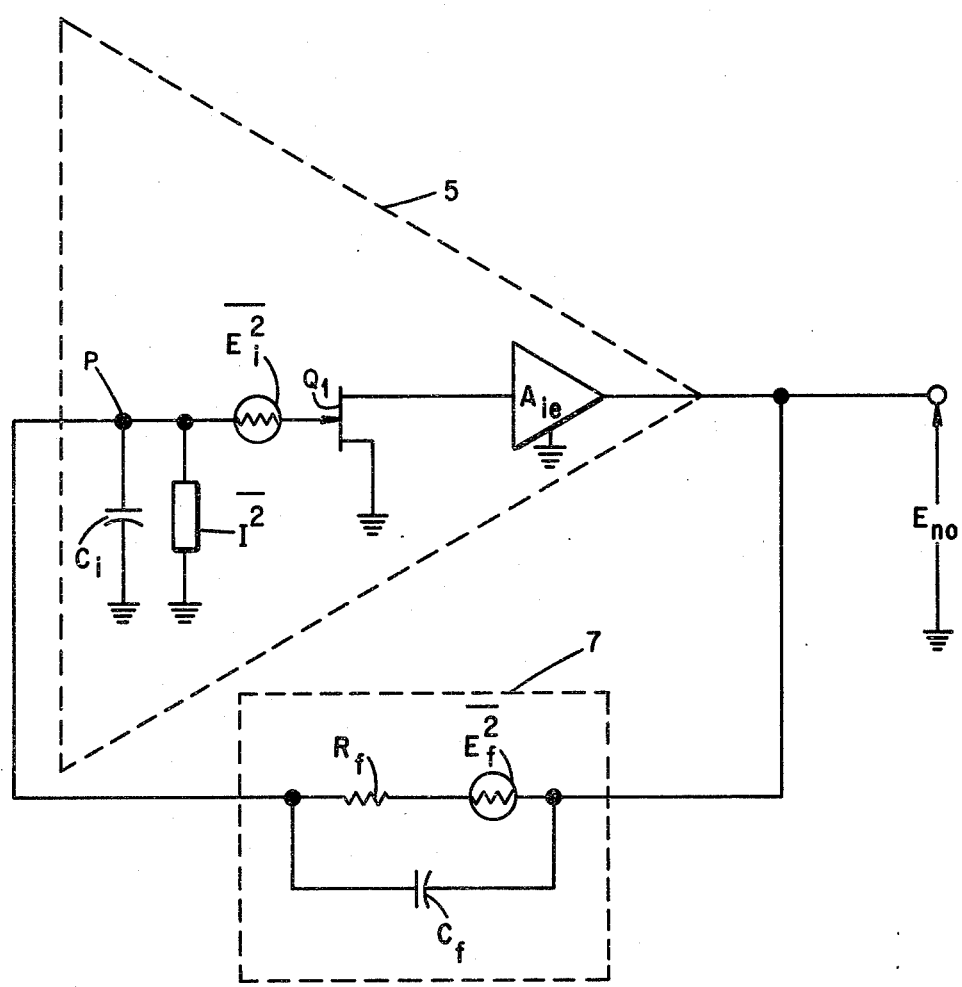
FIG. 1 is a model for illustrating the basic principle of operation of a high-level noise generator according to the present invention.

The manner in which the subject noise generator utilizes a noise generating resistor in the feedback network of an inverting amplifier to produce a noise voltage generated by a high value of R, but coming from an apparent low impedance source, is illustrated in FIG. 1. Provided the forward-path amplifier 5, shown within dotted lines, is designed to have very low noise and a small input capacitance, a white noise spectrum will be obtained at the system output ($E_{no}$) extending up to several MHz and equal in spectral density to the spectral density of the open-circuit noise voltage of the thermal noise generating feedback network 7. The noise voltage is generated in the feedback resistor $R_f$. Furthermore, if the system loop transmission is high, the system output impedance will be sufficiently low to allow considerable loading of the output with negligible influence on the output noise amplitude.

In FIG. 1, the thermal noise voltage of the feedback resistor $R_f$ is modeled by the noise voltage generator $\overline{E_f^2}$ whose value is determined by the aforementioned Nyquist equation. The noise bandwidth ($\Delta f$) may be determined by a signal processing device (not shown) connected at the circuit output. A positive-going noise pulse at the point P results in the noise output voltage $E_{no}$ attempting to go negative to hold point P at zero volts because of the inverted feedback. As a result, the noise voltage of $R_f$ is forced to appear at the output, $E_{no}$. Therefore, $R_f$ can be a moderately large resistor in order to produce the desired high-level noise output. The effective output impedance is approximately the open loop output resistance divided by the open loop voltage gain ($A_{ie}$) from point P to the output. By making the open loop voltage gain very high in the range of from $10^4$ to $10^5$ V/V, the feedback resistor $R_f$ may be as large as 20K ohms, for example, and still result in a low output impedance, when the loop is closed, of less than 0.03 ohms. $R_f$ may have values in the range of from 10K to 50K ohms.

The basic objective of the amplifier 5 for the noise source is to make the value of $\overline{E_{no}^2}$ within 0.1% of the value of the thermal noise voltage $\overline{E_f^2}$, the feedback resistor $R_f$ thermal noise voltage, over as wide a frequency range as possible and also to make $\overline{E_f^2}$ extremely stable (to better than 0.1%). To obtain this objective the noise resistance of the forward path of amplifier 5 must be kept extremely low. In an amplifier designed to obtain a noise source of the above objective, the details of which will be presented hereinbelow, it has been found that the input device Q1 contributes the primary undesirable forward path noise. The forward path noise is of two contributing factors. The series noise resistance modeled here by the series noise generator $\overline{E_i^2}$ (the root mean squared series noise-voltage spectral density) and the parallel noise current here modeled by the current generator $\overline{I_i^2}$ (the equivalent parallel noise-current spectral density). The series noise voltage is generated primarily by the channel resistance of the input device Q1 while the parallel noise current is due to the shot noise of the gate leakage from gate feedback noise current of device Q1. By carefully selecting the proper transistor arrangement Q1 for the input to the amplifier these unwanted noise contributions may be held to less than 0.05% of the root mean squared output noise voltage signal. It has been found that an n-channel junction field effect transistor (JFET) at a low drain-source bias voltage to minimize gate-channel avalanche noise and temperature rise of the active chip which would cause an increase in the channel thermal noise will satisfy the above requirement. Specifically, the input device may be 3 parallel connected JFET's, such as the Texas Instrument Model SFB8558. This input configuration along with other considerations of the remainder of the amplifier which will be explained hereinbelow will provide an amplifier which will satisfy the requirements of the subject noise voltage generator.

A feedback capacitance $C_f$ is provided in the noise voltage generator 7 whose purpose is to flatten the output noise spectrum. This capacitance is very small in the order of a few picofarads and may be a variable capacitor in order to obtain maximal flatness of the output of the amplifier noise frequency bandwidth. This capacitor ($C_f$) is used in conjunction with the undesirable input capacitance modeled by $C_i$ which is primarily the stray input capacitance of the input device Q1.

Thus with the model as shown in FIG. 1, the only current flowing through the feedback network and the resistor $R_f$ from which the noise source voltage $E_{no}$ is generated is the gate leakage current of the input device Q1. By selecting the Q1 network as described above, this current can be held below a few picoamperes, which is so low that the shot noise generated in $R_f$ due to the DC current is negligible.

Thus, by employing the amplifier 5 the output white noise signal in the frequency range of interest is essentially determined by the feedback resistor $R_f$. However, the Nyquist equation requires that the product $T_f R_f$ be a constant for stabilization of the output noise, where $T_f$ is the temperature in degrees Kelvin of the feedback resistor $R_f$. Disclosed below are two embodiments for implementing this requirement: (1) The feedback network 7 is designed so that $R_f$ may be held at a constant temperature by enclosing the resistor $R_f$ in a housing which may be immersed in an ice bath, for example; (2) the feedback network 7 is designed so that the temperature resistance product is constant while allowing both $T_f$ and $R_f$ to change, but in compensating directions.

Implementation of the first embodiment is accomplished by immersing a high-quality metal film feedback resistor $R_f$ with a low-temperature coefficient in an ice bath. The result is accurate control of the $R_fT_f$ product. However, this embodiment requires a temperature bath and physical separation of the feedback resistor from the amplifier. The physical separation usually introduces some shielding problems and other electronic constraints due to an increase in stray circuit elements in the feedback network. Also, heat transfer from the amplifier to the feedback resistor tends to cause the resistor temperature to deviate from the bath temperature. This method of noise output stabilization has been implemented successfully and will be discussed further hereinbelow.

Figure 3:
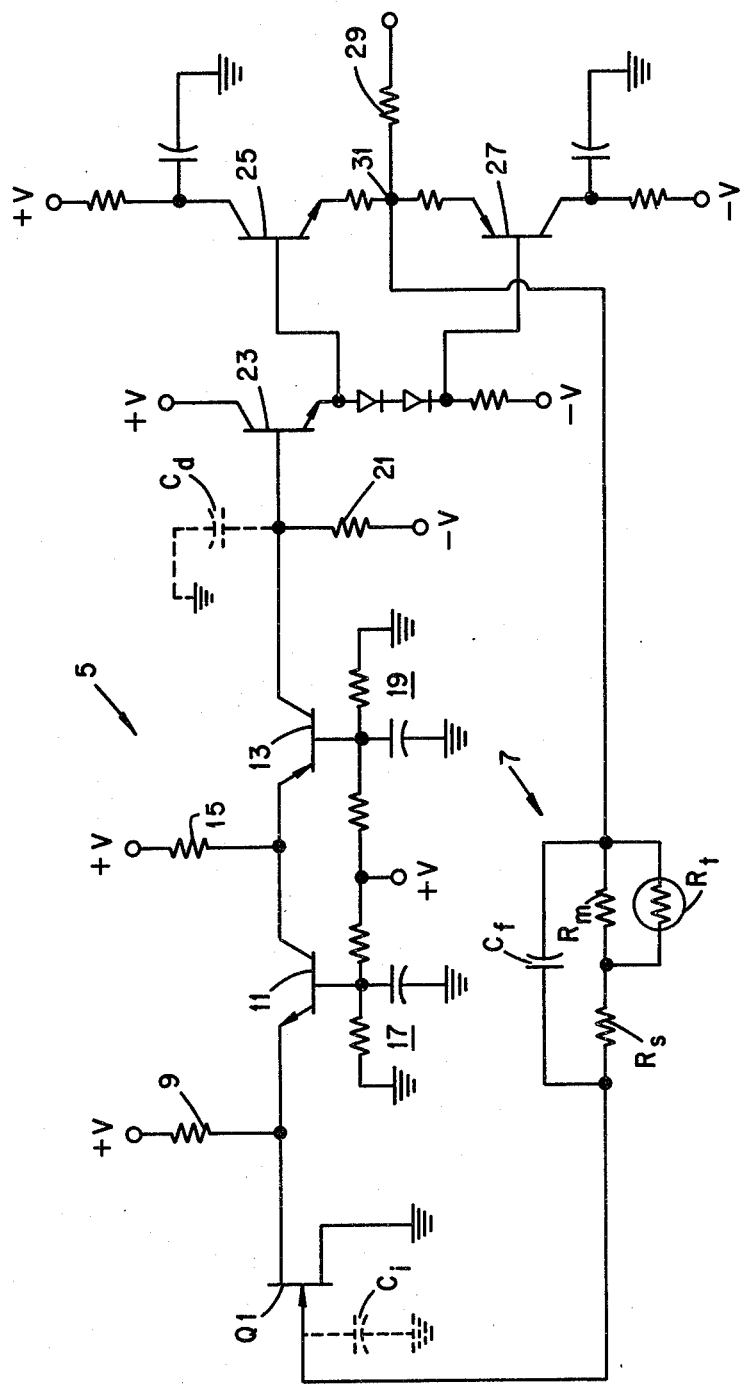
FIG. 3 is a circuit diagram of the constant TR product embodiment of the subject noise generator.

The second embodiment is designed to have a temperature coefficient that makes $R_fT_f$ constant, even with the network exposed to the ambient temperature where changes in $T_f$ would be induced by changes in the ambient temperature. This network is realized by the use of two low-temperature coefficient metal film resistors and one negative temperature coefficient thermistor making up the feedback network 7. This embodiment is shown in FIG. 3.

Figure 2:
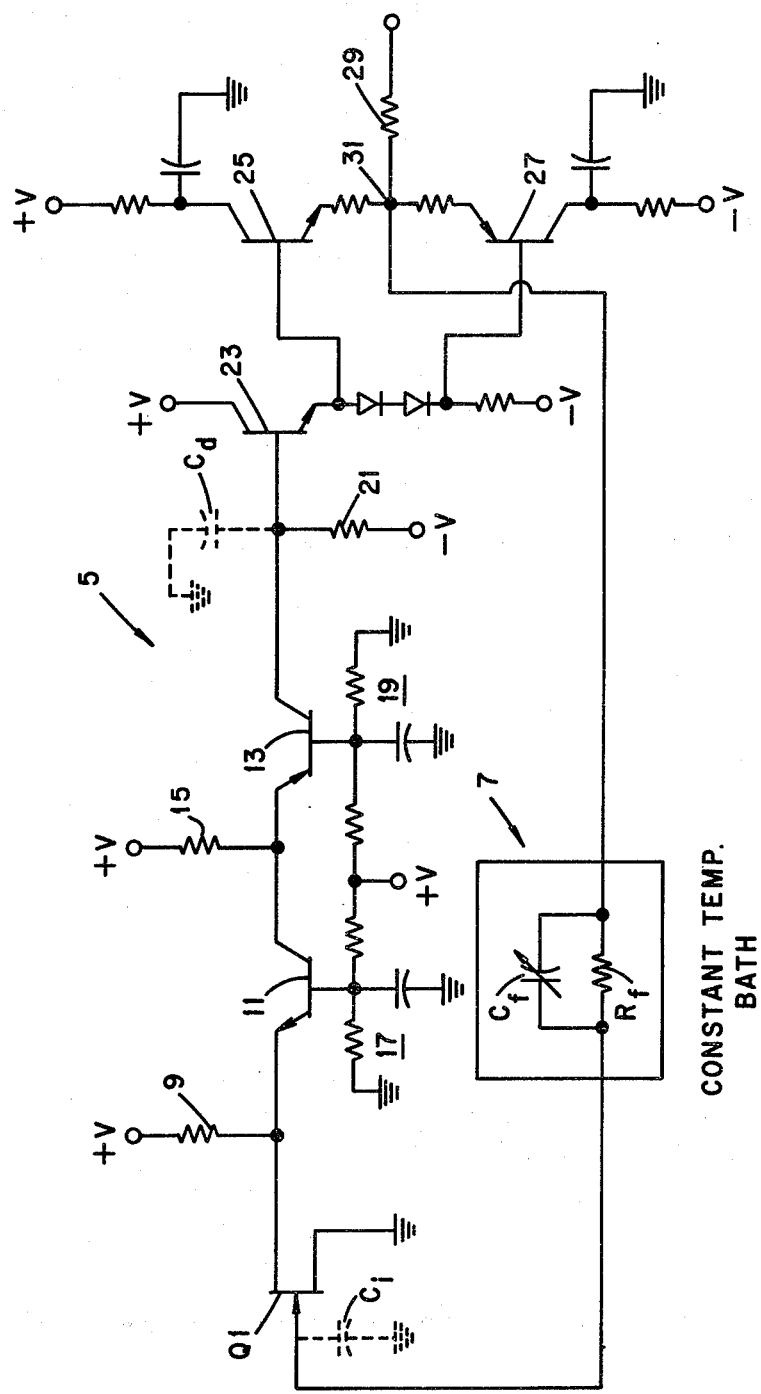
FIG. 2 is a circuit diagram for the constant T, constant R embodiment of the subject noise generator.

Referring now to FIG. 2, wherein the constant $T_f$ constant $R_f$ embodiment is shown, the feedback network 7 consists of the feedback resistor $R_f$ and the parallel capacitor $C_f$ which are held at a constant temperature such as being immersed in an ice bath. $R_f$ is a single high-quality metal film resistor, which is commercially available from Electra Manufacturing Company, Independence, Kans., Model MF5C-E-F. This resistor has a low temperature coefficient and may be immersed, when properly protected, in the ice bath to hold both $T_f$ and $R_f$ at a constant value. This circuit has the advantage of accurate control of the $T_fR_f$ product, but complicates the noise source implementation by requiring the presence of the constant temperature bath and also some physical separation of the feedback resistor from the amplifier. The entire circuit of FIG. 2 may be constructed on a breadboard and installed in a small brass cylinder with copper plates soldered on the top and bottom ends of the cylinder. Power and signal leads may be fed out through copper tubes soldered to the top end plate. The feedback resistor $R_f$ is mounted on the bottom plate and covered with a high thermal conductivity paste to enable good heat transfer between the resistor and bottom plate. By this construction the entire cylinder may be immersed in the ice bath when the noise source output is being used for calibration purposes. The temperature of the feedback resistor may increase about 0.2 to 0.5 K. due to heat generated in the electronics. Vigorous stirring of the ice bath will hold the $T_f$ increase to less than 0.3 K. which causes a very small increase in the output noise power.

As pointed out in FIG. 1 the feedback network is connected to the gate electrode of a high impedance input device Q1, which may be 3 JFET's connected in parallel in order to satisfy the necessary low noise requirements. It will be understood that the input device Q1 may be a single JFET or other device which will satisfy the necessary accuracy requirements for particular applications. The stray input capacitance is shown in phantom as $C_i$. The source electrode of the JFET (Q1) is connected to ground. The drain electrode is connected through a biasing resistor 9 to the positive voltage source. Connected in this manner the input signal is inverted at the drain electrode. The drain of Q1 is further connected in an unusual, folded, double-cascode connection with transistors 11 and 13. The emitter of transistor 11 is connected to the drain electrode of Q1 and the collector of transistor 11 is connected to the emitter of transistor 13 which is further connected through a biasing resistor 15 to the positive voltage source. The bases of transistors 11 and 13 are connected, respectively, to base voltage biasing circuits 17 and 19. The transistors 11 and 13 are preferably bipolar transistor types 2N3571 and 2N4958, respectively, which can be operated at very high frequencies. Typical specifications for these transistors are the following: gain-bandwidth product $F_t$ approximately 1 GHz, small-signal short-circuit current gain in the range of from 100 to 150, and collector-base capacitance approximately 0.8 pf. Thus, the total capacitance at the collector of transistor 13 is approximately 3 pf which produces a high-frequency 3-DB point of about 3.6 MHz.

The unusual, folded, double-cascode connection of the transistors Q1, 11 and 13 has the advantage of allowing operation of the Q1 n-channel junction field-effect transistor at a low drain-source bias voltage (2 volts) to minimize gate-channel avalanche noise and temperature rise which would cause an increase in the channel thermal noise generated in Q1. This folded double-cascode arrangement with a DC voltage of about 6 volts at the emitter of transistor 13, allows an output positive voltage excursion of about 4.6 volts which is more than adequate. An additional advantage of the folded double-cascode is that the collector-base bias voltages for transistors 11 and 13 are higher than the voltages in an ordinary cascode arrangement, which increases the high-frequency performance of these transistors. The collector of transistor 13 is connected to the negative voltage supply through a gain control resistor 21. Further the collector of transistor 13 is connected to the base of a bipolar transistor 23 which is connected in an emitter-follower configuration. Transistor 23 is selected to have a high input impedance to prevent loading the circuits gain control resistor 21.

The forward path of the amplifier is designed to have a single dominant pole at the base of transistor 23. The total capacitance at the base of transistor 23 is about 3 pf, as represented by phantom capacitance $C_d$, which produces a high-frequency 3-DB point of about 3.6 MHz. The high-frequency 3-DB points at the other internal circuit nodes are near that of the respective transistors and are therefore negligible compared to the 3.6 MHz dominant forward-path 3-DB frequency.

The output circuit consists of transistors 25 and 27 and their associated biasing networks connected in a complementary emitter-follower configuration that allows the circuit to drive plus and minus noise output signals equally well. A resistor 29 is connected at a point 31 between the emitter resistors of the output transistors 25 and 27 for series connection with the output terminal of the circuit, the output terminal of the noise generator, to prevent parasitic oscillations when coupling the noise source to a load. The resistor can be a value which also matches the characteristic impedance of a transmission cable; therefore, typical resistor values would be in the range of from 50 to 125 ohms. The circuit feedback is taken also at the output transistor emitter intermediate connection point 31 which is connected to the feedback network 7.

Since the open loop output impedance is quite low (about 25 ohms), and the open-loop gain of the amplifier 5 is about $4 \times 10^4$, closing the feedback path through the network 7 lowers the output impedance into the milliohm region. In order to achieve a noise spectrum that is essentially flat into the MHz region, high frequency transistors should be selected for the circuit and mounted on a thick copper sheet ground plane. Also, the values of $C_d$ and $C_f$ should be carefully chosen so as to maintain a flat response over the entire noise bandwidth of the noise generator. Also, all the resistors used in the circuit are preferably low temperature coefficient metal film resistors to minimize shot noise generation in the amplifier circuit.

The constant $T_f$-constant $R_f$ noise source of FIG. 2 was evaluated using a voltage processing channel of a JNPT which was calibrated using a platinum resistor at the aluminum freeze point temperature (933.52 K.) as the noise source. The output noise of the generator of FIG. 2 was compared with the thermal noise generated by the platinum resistor of known ohmic value at the known aluminum freeze point temperature. Then noise voltage output was measured with a calibrated JNPT channel. From this result $R_f$ could be determined. The measured value was 0.46% higher than the calculated value. Thus, the noise source calibration constants were adjusted by calibration against the aluminum freeze point temperature and resulted in calibration errors of less than 0.1%.

Referring now to FIG. 3, wherein the amplifier 5 is identical to that of the circuit of FIG. 2 and is illustrated by like reference characters corresponding to FIG. 2, there is shown the constant $T_f R_f$ product embodiment wherein the single feedback resistor $R_f$ (FIG. 2) is replaced by a synthesized network consisting of two low-temperature coefficient metal film resistors $R_s$ and $R_m$ in series, and one negative-temperature coefficient thermistor $R_t$ in parallel with $R_m$. This network connected in parallel with the capacitance $C_f$ identical to that of FIG. 2 makes up the thermal noise voltage generating feedback network 7 of this embodiment. This embodiment may be used in the field for calibrating instruments and does not require the constant temperature bath as in the network of FIG. 2 which may be used as a standards instrument.

The resistors $R_s$ and $R_m$ are low-temperature coefficient metal film resistors. Thus, since the temperature coefficient of the resistors $R_m$ and $R_s$ are negligibly small and the temperature coefficient of $R_t$ is negative, the product $T_f R_f$ is constant and thus the output noise variation with temperature can be made negligibly small. The composite feedback resistance $R_f$ will have the correct temperature coefficient if the following relationship of the parameters of the network is satisfied $$R_m = \frac{R_t}{\left[ -\frac{R_t T_f}{R_f} \left( \frac{dR_t/dT_f}{R_t} \right) \right]^{\frac{1}{2}} - 1}.$$

In this equation it is assumed that the temperature coefficients of $R_m$ and $R_s$ are negligibly small. Since the temperature coefficient of $R_t$ is negative, the derivative $dR_t/dT_f$ is negative. As a result, the radical is positive. It is necessary to choose the value of $R_f$ so that the radical is greater than unity to ensure that $R_m$ has a positive resistance value.

The $T_f R_f$ product of this embodiment was measured with a Johnson Noise Power Thermometer (JNPT) voltage processing channel. The voltage channel had been carefully calibrated using a 167-ohm platinum resistor at the aluminum freeze point temperature (933.52 K.). Next, the resistance of the synthesized feedback resistor ($R_f$) in FIG. 3 was measured at $T_f = 300$ K with a 0.01% bridge. The entire $R_f$ network was immersed in a mineral oil bath during the bridge measurement to hold all the components at the temperature $T_f = 300$ K. The bridge measurement of $R_f$ was within 0.02% of the value determined from the measurement with the calibrated JNPT voltage channel.

The stability of the output noise voltage with ambient temperature variations was determined by measuring the output noise RMS voltage with the JNPT voltage channel. A total of 21 voltage measurements were taken over an ambient temperature range of 9° C. to 43° C. The standard deviation of the data points was 0.03% of the average value. The difference between the maximum and minimum voltage values was 0.08% of the average voltage. The result indicated that changes in the noise output level with small variations in ambient temperature (±15% C.) are negligibly small. Thus, the noise source of FIG. 3 may be useful for calibrations to less than 0.1% without the use of the constant temperature bath.

In the feedback network of FIG. 3 the resistance value $R_s$ is typically 17.8K ohms, $R_m = 6.81$K ohms and thermistor $R_t$ has a nominal value of approximately 10K ohms. This gives an overall synthesized $R_f$ equal to 21.52K ohms at the temperature of 300 K.

In the embodiment of FIG. 3 the components were mounted on a 5-millimeter-thick, copper ground plane that is 7.7 centimeters long and 4 centimeters wide. The metal cases of all the transistors were inserted into holes in the ground plane for maximum shielding. Connections between components were minimum length and all bias lines were fed through RF filters mounted in the ground plane. The entire circuit is enclosed in a steel box. The noise output was available from an insulated BNC connector to allow control of ground paths.

Thus, it will be seen that a white noise voltage generator has been provided which satisfies the need for a precision random signal noise source in a wide range of measurement science applications. Among these applications are (1) calibration of systems for measuring random noise from devices, etc., (2) measurement of system noise bandwidths, (3) determination of transfer functions, and (4) studies of the effects of injected noise into various parts of a signal processing or control system.

Although the invention has been illustrated by means of the description of two embodiments, it will be obvious to those skilled in the art that various modifications and changes may be made in the circuits without departing from the spirit and scope of the invention as set forth in the following claims attached to and forming a part of this specification.

What is claimed is:
1. A high-level, white noise generator, comprising:
an inverting amplifier having an output from which said white noise signal is available; and
a thermal noise voltage signal generating feedback network connected between the output and the input of said amplifier including a series resistor means ($R_f$) for generating said thermal noise voltage signal in accordance with the following equation:

$$\overline{E_n^2} = 4KT_f R_f \Delta f,$$

wherein $\overline{E_n^2}$ is the open circuit RMS thermal noise voltage, K is the Boltzmann constant, $T_f$ is the absolute temperature of the resistance ($R_f$) in Kelvins, $R_f$ is the feedback resistance in ohms, and $\Delta f$ is the noise bandwidth in hertz, said amplifier having an internal generated noise signal level substantially less than said thermal noise voltage signal generated by said feedback network.

2. The noise generator of claim 1 wherein said series resistance means is a metal-film resistor connected between the input and output of said amplifier.

3. The noise generator of claim 3 wherein said feedback network for generating said thermal noise voltage signal further includes means for maintaining said series resistor at a constant temperature, thereby maintaining the product $R_f T_f$ constant.

4. The noise generator of claim 1 wherein said series resistance means of said feedback network includes a pair of thermal noise signal generating resistors connected in series between the input and output of said amplifier and a negative temperature coefficient resistance means connected in parallel with one of said resistors for maintaining the $R_f T_f$ product constant for changes in ambient temperature.

5. The noise generator of claim 1 wherein said inverting amplifier includes an input circuit means including at least one junction field-effect transistor having gate, drain and source electrodes wherein said gate electrode is the input terminal of said amplifier said source electrode is connected to ground potential and a positive voltage source is connected to said drain electrode so that the input impedance of said amplifier is sufficient to limit the feedback current flow through said feedback network to a value such that the noise signal level generated in said feedback current is substantially less than the thermal noise voltage signal level generated in said feedback network, an output circuit means having a voltage gain near unity, and a series connected pair of opposite polarity bipolar transistors connected between the drain electrode of said junction field-effect transistor and said output circuit means in a folded, double-cascode arrangement with said junction field effect transistor.

6. The noise generator of claim 5 wherein said feedback network further includes a capacitor connected between the input and output of said amplifier having a selected capacitance for maintaining spectral flatness over the noise signal bandwidth of the output of said amplifier.

7. The noise generator as set forth in claim 6 wherein said feedback network resistance $R_f$ is in the range of from 10K to 50K ohms for output impedance of said amplifier in the range of from 0.01 to 0.1 ohms.

* * * * *